United States Patent [19]
Boldt et al.

[11] Patent Number: 5,446,741
[45] Date of Patent: Aug. 29, 1995

[54] FAST MEMORY POWER-ON DIAGNOSTICS USING DMA

[75] Inventors: Gerald D. Boldt, Longmont, Colo.; Stephen D. Hanna, Tucson, Ariz.; Robert E. Vogelsberg, Boulder, Colo.

[73] Assignee: International Business Machines Corporation, Armonk, N.Y.

[21] Appl. No.: 171,989

[22] Filed: Dec. 23, 1993

Related U.S. Application Data

[63] Continuation of Ser. No. 561,835, Aug. 2, 1990, abandoned.

[51] Int. Cl.⁶ .................. G06F 11/00; G06F 11/22
[52] U.S. Cl. .................. 371/21.1; 371/21.2; 371/22.5
[58] Field of Search ............. 395/575; 371/21.1, 21.2, 371/22.5

[56] References Cited

U.S. PATENT DOCUMENTS

| | | | |
|---|---|---|---|
| 3,614,400 | 10/1971 | Farnett et al. | 235/152 |
| 4,030,073 | 6/1977 | Armstrong, Jr. | 340/172.5 |
| 4,127,768 | 11/1078 | Negi et al. | 235/304.1 |
| 4,139,818 | 2/1979 | Schneider | 324/73 R |
| 4,312,066 | 1/1982 | Bantz et al. | 371/16 |
| 4,695,946 | 9/1987 | Andreasen et al. | 364/200 |
| 4,715,034 | 12/1987 | Jacobson | 371/21 |
| 4,873,705 | 10/1989 | Johnson | 371/21.1 |
| 4,980,888 | 12/1990 | Bruce et al. | 371/21.1 |
| 5,109,382 | 4/1992 | Fukunaka | 371/21.1 |
| 5,155,844 | 10/1992 | Cheng et al. | 395/575 |

OTHER PUBLICATIONS

Article Titled "Bit Programmable Pattern Generator", IBM Technical disclosure Bulletin, vol. 21, No. 3, Aug. 1978, pp. 897-901.
Article Titled "Power On Machine Check for Multi-Processor System", IBM Technical Disclosure Bulletin, vol. 25, No. 3B, Aug. 1982, pp. 1776-1777.
Article Titled "Use of Memory Cache for Main Memory Failure Mode Analysis" IBM Technical Disclosure Bulletin, vol. 25, No. 4, Sep. 1982, pp. 1849-1852.
Article Titled "Implementation of Reserve Storage for Bit/Word Hard Failures In Main Memory without Software Support", IBM Technical Disclosure Bulletin, vol. 26, No. 4, Sep. 1983, pp. 1843-1845.
Article Titled "Display of Power-On Self-Test Results", IBM Technical Disclosure Bulletin, vol. 28, No. 5, Oct. 1985, pp. 2265-2266.
Article Titled "Non-Continous Memory Hardware Assist Algorithm", vol. 29, No. 11, Apr. 1987, pp. 4913-4914.
Article Titled "fully Self-Contained Memory Card Extended Error Checking/Correcting Hardware Implementation", IBM Technical Disclosure Bulletin, vol. 31, No. 5, Oct. 1988, pp. 352-355.
Article Titled "Loadable Power On Self Test Adapter Setup Table", IBM Technical Disclosure Bulletin, vol. 31, No. 12, May 1989, p. 212.
Article Titled "Bus Hardware Diagnostic Interface", IBM Technical Disclosure Bulletin, vol. 32, No. 3A, Aug. 1989, pp. 372-375.
Article Titled "Data Processing Initialization", IBM Technical Disclosure Bulletin, vol. 13, No. 8, Jan. 1971, pp. 2252-2254.

*Primary Examiner*—Kevin A. Kriess
*Assistant Examiner*—Dennis M. Butler
*Attorney, Agent, or Firm*—Carl M. Wright; Saul A. Seinberg

[57] ABSTRACT

Memory testing is performed by a dedicated hardware system, initialized by a system processor and employing the processor's DMA capability to allow the system to execute other programs without having to wait until memory testing is completed. The same hardware can be utilized as a memory scrubber.

5 Claims, 3 Drawing Sheets

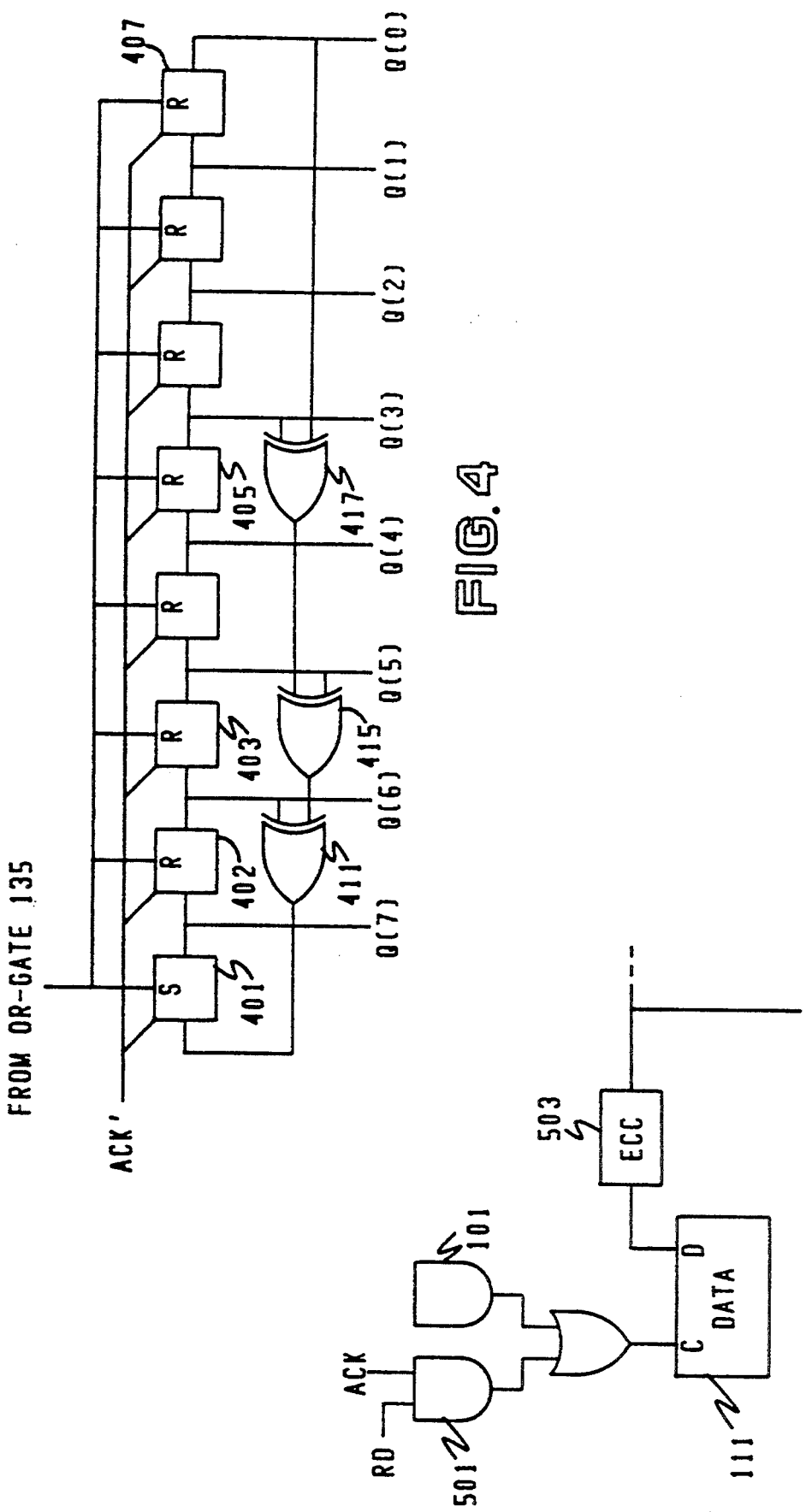

FAST MEMORY POWER-ON DIAGNOSTICS USING DMA

This is a continuation of application Ser. No. 07/561,835 filed Aug. 2, 1990, and now abandoned.

DOCUMENTS INCORPORATED BY REFERENCE

U.S. Pat. No. 3,614,400 is hereby incorporated by reference to show pseudo-random sequence generators using modulo-2 sum feedback connections in shift registers.

BACKGROUND AND SUMMARY OF THE INVENTION

This invention relates to power-on memory self-testing and initialization and particularly to apparatus for performing the memory testing using DMA (Direct Memory Access).

Computer systems periodically test their associated memory, usually when initially applying power. Various patterns are written to and read from the memory to insure proper operation. The final pattern can be an initialization pattern, important when ECC (Error Correction Code) capability is utilized during memory operation.

Such memory tests are usually performed under the control of the main processor as part of a power up initialization routine (POR). As a result, the user must wait until the entire memory check has been performed. As the amount of memory increases, even on small systems, the time required to perform the tests becomes substantial in terms of productivity of the system.

U.S. Pat. No. 4,695,946 (Andreasen et al) shows a computer network having a processor that operates to initialize and to maintain remote diagnostic terminals through system integrity checks and to display data errors or faults in the network. A maintenance program initiates start-up and self-test routines in a sequence order to establish the integrity of the network units. The patent shows memory operations that are program controlled.

U.S. Pat. No. 4,312,066 (Bantz et al) describes a system having a processor that diagnoses or debugs another host processor in order to troubleshoot the latter's hardware and software. The system comprises an interface between the debugging processor and the tested processor to be diagnosed. The tests are performed under program control.

U.S. Pat. No. 4,127,768 (Negi et al) describes diagnostic testing of a central processor provided with a memory coupled to the processor having no requirement for an input device such as a tape or card reader. Local storage of a test program is provided in the processor which, under control of a local control store, transfers the test program to the memory for execution. The central processor is thereby tested to ensure a basic performance level, but under program control.

U.S. Pat. No. 4,030,073 (Armstrong, Jr.) describes an initializing circuit for a digital computer. When the power supply for a digital computer is turned on, the circuit transmits overriding addressing signals. These signals can also be initiated through a console switch and divert the computer from a normal initializing routine to a specially provided initializing routine from the circuit. The program of the initializing circuit includes digital computer instruction sequences for performing preliminary diagnostics and for transferring instructions to a main memory from selected peripherals. When the program terminates, the computer is prepared to process other programs. The diagnostics, however, run under program control.

This invention quickly frees the processor to run other programs by use of a separate hardware system employing the DMA capability of the system to perform the tests.

The technique significantly decreases processor intervention needed for initial power-on memory diagnostics. Page printers, for example, have a large amount of memory so that entire pages can be completely assembled while other pages are being printed. The decreased time between power-on and the execution of application programs significantly increases system productivity.

According to the invention, an address register, a data register, and a termination register are provided. The present termination register can indicate the length of memory to be tested or a termination address at which memory testing is ended.

When the memory is to be tested, e.g., when power is applied to the system, the processor initializes the hardware, perhaps after testing a small, predetermined amount of memory for initial or boot strap operations. The address register is loaded with the address of the first memory location to be tested and the data register is loaded with the data pattern to be written to the memory. Each memory location in succession, beginning at the address in the address register, is written with the pattern stored in the data register by incrementing the address register contents. When the memory under test (MUT) has been written with a given pattern, the apparatus then switches to a read mode, reinitializes the address register, and reads each successive MUT location, comparing the data read with the contents of the data register. If an inequality in the compare operation occurs, then an error interrupt is transmitted to the processor. The location of the error in the MUT can then be read by the processor from the address register because the test operation is halted. If the test is successfully completed, then a termination signal is sent to the processor. Upon receipt of a termination signal, the processor can load the other patterns, the desired initialization pattern being the final pattern.

The data register can supply pseudo-random memory patterns by implementation as a shift register employing modulo-2 summing feedback connections.

Other predetermined data patterns can be generated. For example, binary up-down counters, gray code counters, or special generators for sequences designed to stress the particular memory design can be used. The invention can also be implemented so that the address of the first detected failure is preserved in a special register addressable by the system processor so the test can continue until a second error is encountered.

A variation of the described invention can be used as a memory scrubber. Some types of memories, typically DRAMs (Dynamic Random Access Memories), are subject to temporary errors, usually called soft errors, caused by alpha particles or other phenomena. Soft errors commonly are the result of a change in value of single bits in the memory due to the action of an alpha particle. (An alpha particle is the nucleus of a helium atom and, when accelerated, has sufficient energy to affect the finely structured DRAM cells that store individual bits when collisions occur, sometimes causing the value stored in the cell to be altered.) Occasionally, soft errors may be caused by electrical noise. Soft errors can be rewritten correctly, unlike hard errors which are permanent.

Memory scrubbing is a process whereby a memory location is read using ECC to correct any single bit errors. When the corrected data are written back to the same memory location, any soft errors that occurred on read out will be eliminated.

The system according to the invention automatically executes a memory read command, with ECC, followed by executing a memory write command to the area of memory being scrubbed for soft errors. Better performance results from executing multiple memory read commands into an internal set of registers in the hardware followed by executing multiple memory write commands. The scrubbing operation can be performed by having the hardware read data and write data to the same set of addresses.

The writing and reading operations of the memory are performed using the processor's DMA facility so as to cause as little interference as possible with the processor's operation.

BRIEF DESCRIPTION OF THE DRAWING

The invention is described in detail by referring to the various figures which illustrate specific embodiments of the invention, and wherein like numerals refer to like elements.

FIG. 4 is a logic diagram of a pseudo-random pattern generator.

FIG. 5 is a logic circuit for substitution into the system of FIG. 1 to perform memory scrubbing.

DESCRIPTION OF THE PREFERRED EMBODIMENT

Figure 1:
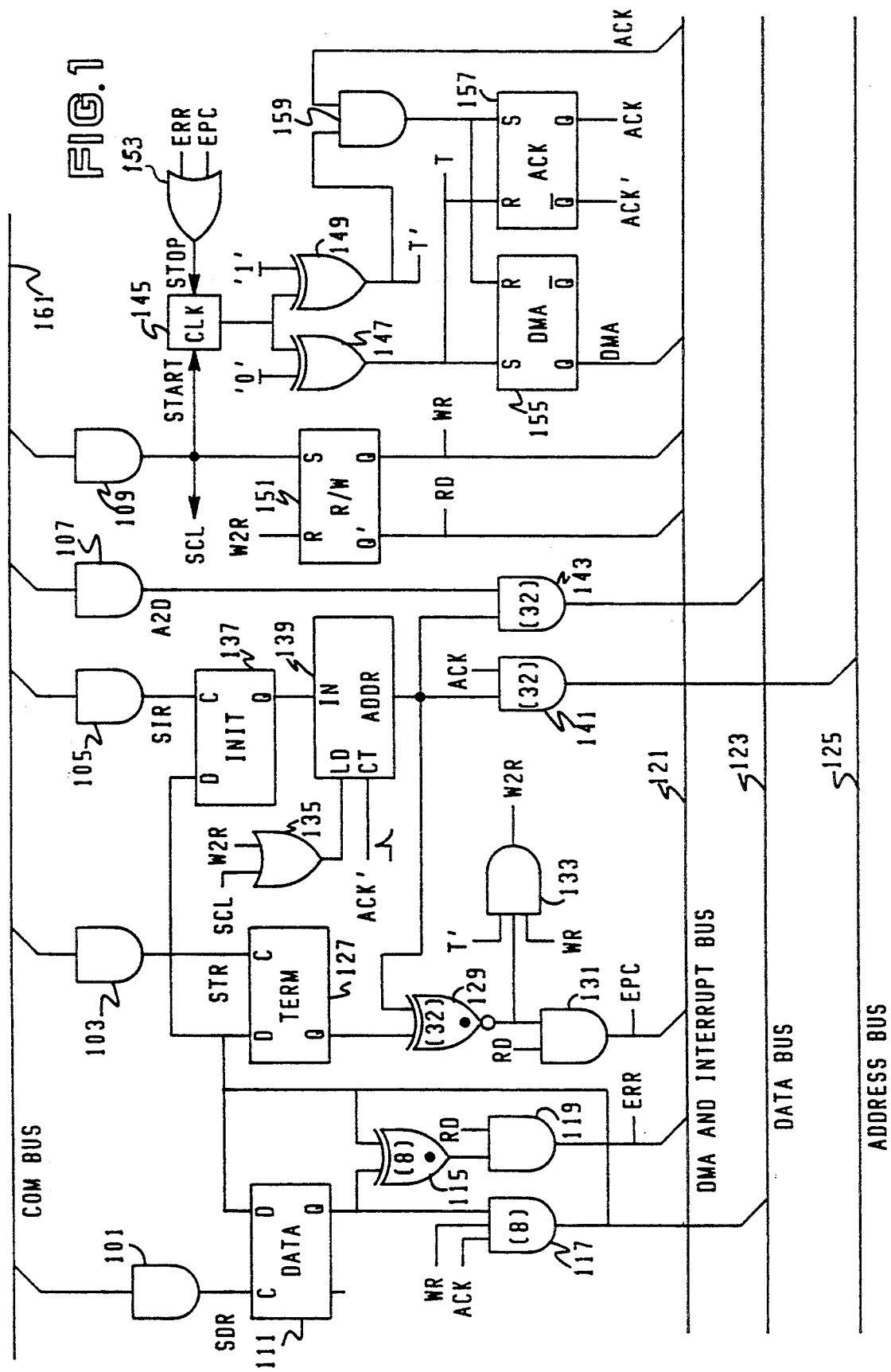
FIG. 1 is a logic diagram of a hardware system for practicing the invention.

A preferred embodiment for a hardware system that will perform the function of the invention is shown in FIG. 1. Various registers are set by a system controlling processor, described below, to initiate the memory test procedure.

In the logic block diagram of FIG. 1, certain register and gate symbols represent several devices in parallel. For example, registers holding address and data have as many stages as necessary to hold the number of bits constituting the address or data, respectively. Gates coupling the registers to the buses also comprise the necessary number of devices for parallel gating.

Specifically, the data will be assumed to be eight bits wide and addresses, 32 bits wide for illustrative purposes. Therefore, the AND gate symbol 117 represents eight AND gates in parallel, the comparator 115 is eight XOR gates in parallel, infra, and the data register 111 is eight flip-flops in parallel.

A communication bus 161 is coupled to a communications output port of the controlling processor. An interrupt bus 121 is coupled to the interrupt input ports of the controlling processor. A data bus 123 and an address bus 125 are coupled to the processor bus and to the system memory.

To initiate the memory test process, various registers are set by the processor via the communication bus 161 and data bus 123.

Commercially available processors, including microprocessors, have buses corresponding those described above. Their functions and operations are well known and need no further description for an understanding of the invention.

The memory address at which testing is to start is gated into an initial register (INIT) 137. The processor gates the data representing the initial address onto the data bus 123. A decoder 105 is activated by a particular bit pattern on the communication bus 161, typically an 8-bit pattern but it can be a 16- or 32-bit pattern, depending on the model of processor. The decoder 105 supplies a signal SIR, Set Initial Register, which gates the information from the communication bus 161 into the INIT register 137.

In the embodiment being described, a termination address is set into a TERM register 127 by a pattern on the communications bus 161 detected by decoder 103 which generates a signal STR, gating the data from the communication bus 161 into the TERM register 127. Data to be used as the test pattern is gated into a data register 111 by an SDR signal generated by a decoder 101 in response to a particular bit pattern supplied by the processor over the communication bus 161 when the data is on the data bus 123.

When the data register 111, initial address register 137, and the termination register 127 have been loaded, the processor supplies a bit pattern on the communication bus 161 which is detected by a decoder 109 to generate a signal SCL which starts a clock circuit 145. The SCL signal also sets a read/write register R/W 151. The read/write register 151 output is thereby initialized as a write command, WR.

The SCL signal from the decoder 109 is also applied to an OR gate 135 which generates an output signal that loads the contents of the INIT register 137 into an address counter 139, which can be incremented by a count signal, ACK'. As indicated in the schematic, the leading edge of the ACK' signal increments the contents of the address register 139. The output signal from the clock 145 is applied to one input of a pair of exclusive-OR (XOR) gates 147 and 149 having the other input signals logical zero ('0') and logical one ('1'), respectively. The T output signal from the XOR gate 147 and the T' output signal from the XOR gate 149 provide a non-overlapped two-phase clock system. In response to a high ('1') output signal from the clock, the XOR gate 147 is activated to produce the T signal and sets a DMA register 155 which supplies a DMA interrupt signal to the processor system. The signal from the XOR gate 147 also resets an acknowledge register ACK 157.

The DMA signal from the register 155 supplies a DMA request signal to the controlling processor, which, when granted, returns an acknowledge signal which primes an AND gate 159 from the interrupt bus 121. When the acknowledge signal from the interrupt bus 121 is active, the next negative-going pulse from the clock 145, which produces an output signal from the XOR gate 149, T', activates an AND gate 159 which acts to set the acknowledge register ACK 157 and to reset the DMA request register 155. The acknowledge signal, ACK, from the register 157 is applied to an AND gate 141, gating the address from the address counter 139 onto the address bus 125.

The acknowledge signal ACK is also applied to an AND gate 117 which, when the read/write register 151 is set to the write state, gates the contents from the data register 111 onto the data bus 123. This causes the data pattern in the data register 111 to be written into the memory at the address stored in the address counter 139.

The next positive-going signal from the clock 145, through the XOR gate 147, generates another DMA request by setting the DMA register 155 and resets the ACK register 157. The resetting of the ACK register 157 increments, by the rising edge of ACK', the address counter by a value of one. Therefore, with the next acknowledge signal from the processor to initiate the DMA cycle previously described, the write process described above is repeated but at a successive address since the contents of the address register 139 have been incremented.

The output signal from the address counter 139 is coupled to an equality comparator 129, which can be implemented as a network of parallel exclusive-OR gates and generates an output signal when the contents of the address counter 139 equal the termination address in the TERM register 127. The write process described above continues until the equal comparator 129 produces an output signal EPC. An AND gate 133 generates a W2R signal in response to the EPC signal during the write state (WR) which, ANDed with a T' signal from the clock logic, resets the R/W register 151. The W2R signal is also applied to an input terminal of the OR gate 135, loading the initial address from the INIT register 137 into the address counter 139. The output signal from the R/W register 151 indicates that the read state is now active.

The DMA request and acknowledge signals alternate as previously described, but, in the read state, data from the address in the address counter 139—via the AND gate 141 in response to the ACK signal to the address bus 125—is compared to the contents of the data register 111 by an unequal comparison circuit 115, which can be implemented as a network of parallel XOR gates with output terminals wire-ORed together (as indicated by a dot). If the data on the data bus is not the same as the data pattern in the data register 111, the output signal from the unequal comparator circuits 115 activate an AND gate 119 which is primed by the read signal from the R/W register 151. The output signal from the AND gate 119 indicates an error in the memory check and causes an error interrupt signal to be raised on the interrupt bus 121. The output signal from the AND gate 119, ERR, is also applied to an OR gate 153 which stop the clock 145.

In response to the error interrupt signal from the AND gate 119, the processor executes an interrupt routine, one of the functions of which is to determine at which address the error occurred. This is accomplished by supplying a unique bit pattern on the communication bus 161 which is detected by a decoder 107 to activate an AND gate 143 which gates the address in the address counter 139 onto the data bus 123 from which it can be read by the processor for further processing.

The error interrupt routine executed by the processor depends on the needs and philosophy of the particular system in which the invention is used and need not be described in further detail for an understanding of the invention.

The read cycle continues as long as the data read from the memory is the same as that in the data register 111. If the address register 139 is the same as the contents of the termination register 127, the output signal from the comparator 129 activates an AND gate 131, producing an EPC signal (End of Pattern Check). The EPC signal raises an interrupt signal on the interrupt bus 121 and also, through the OR gate 153, stops the clock 145.

In response the EPC interrupt, the processor can cause a new pattern to be cycled through the memory under test by loading a new data pattern into the data register 111 by putting the new pattern on the data bus 123 and generating the SDR bit configuration on the communication bus 161.

The data register 111 can alternatively be a pseudo-random data generator implemented by shift registers as shown in the U.S. Pat. No. 3,614,400 incorporated herein by reference.

A possible pseudo-random pattern generator is shown in FIG. 4 as an eight-stage shift register with modulo-2 feedback. The first shift register stage 401 is set and the remaining stages are reset by the output signal from the OR gate 135 (FIG. 1) to initialize the pattern.

The shift signal is ACK' from the ACK flip-flop 157 (FIG. 1).

The output signals from each stage Q(7)–Q(0) are coupled to the AND gate network 117 instead of the output signals from the DATA register 111.

The setting of each register stage is shifted one stage to the right each time the ACK' occurs. The value shifted into the first stage 401 depends on the settings of the second stage 402, the third stage 403, the fifth stage 405 and the last stage 407.

An XOR gate 417 (a modulo-2 sum gate) is coupled to the output signals Q(3) and Q(0), producing a high ('1') signal when the values of Q(3) and Q(0) are different from another.

The output signal from the XOR gate 417 is an input signal for an XOR gate 415, the other input being Q(5). Similarly, the output signal from the XOR gate 415 is an input signal to an XOR gate 411 having its other input signal Q(6) from the shift register stage 402.

The output signal from the XOR gate 411 is the input signal to the shift register stage 401. Therefore, a value of '1' is shifted into the first stage 401 whenever the sum of the settings of the second (402), third (403), fifth (405) and final (407) shift register stages is an odd number, i.e., 1 modulo-2.

The feedback connections shown in FIG. 4 form a maximum length sequence generator, i.e., the number of bytes in the sequence produced is $2^n - 1$ where n is the number of stages. The pseudo-random generator of FIG. 4 produces a sequence of 255 ($2^8 - 1$) unique bytes in a seemingly random order. (The all zero pattern does not occur.)

Details of maximum length sequence generators are discussed in U.S. Pat. No. 3,614,400 (incorporated herein by reference) and in *Error-Correcting Codes*, 2nd Ed., by W. W. Peterson and E. J. Weldon, Jr. (MIT Press, 1972).

Other well known ECC schemes can be used such as Hamming codes.

In the following description, references are made to the flowcharts depicting the sequence of operations performed by the program. The symbols used therein are standard flowchart symbols accepted by the American National Standards Institute and the International Standards Organization. In the explanation, an operation may be described as being performed by a particular block in the flowchart. This is to be interpreted as meaning that the operations referred to are performed by programming and executing a sequence of instructions that produces the result said to be performed by the described block. The actual instructions used depend on the particular hardware used to implement the invention. Different processors have different instruction sets but the person of ordinary skill in the art is familiar with the instruction set with which he works and can implement the operations set forth in the blocks of the flowchart.

Subroutines are computer program modules that are not placed directly in the stream of instructions in which they are used. Subroutines are invoked by call and link procedures which cause the program execution to transfer to the list of computer instructions comprising the subroutine program and to link or to supply the operands used by the subroutine. When a subroutine has completed execution, the program control returns to the instruction in the calling program following that which called the subroutine.

Figure 2:
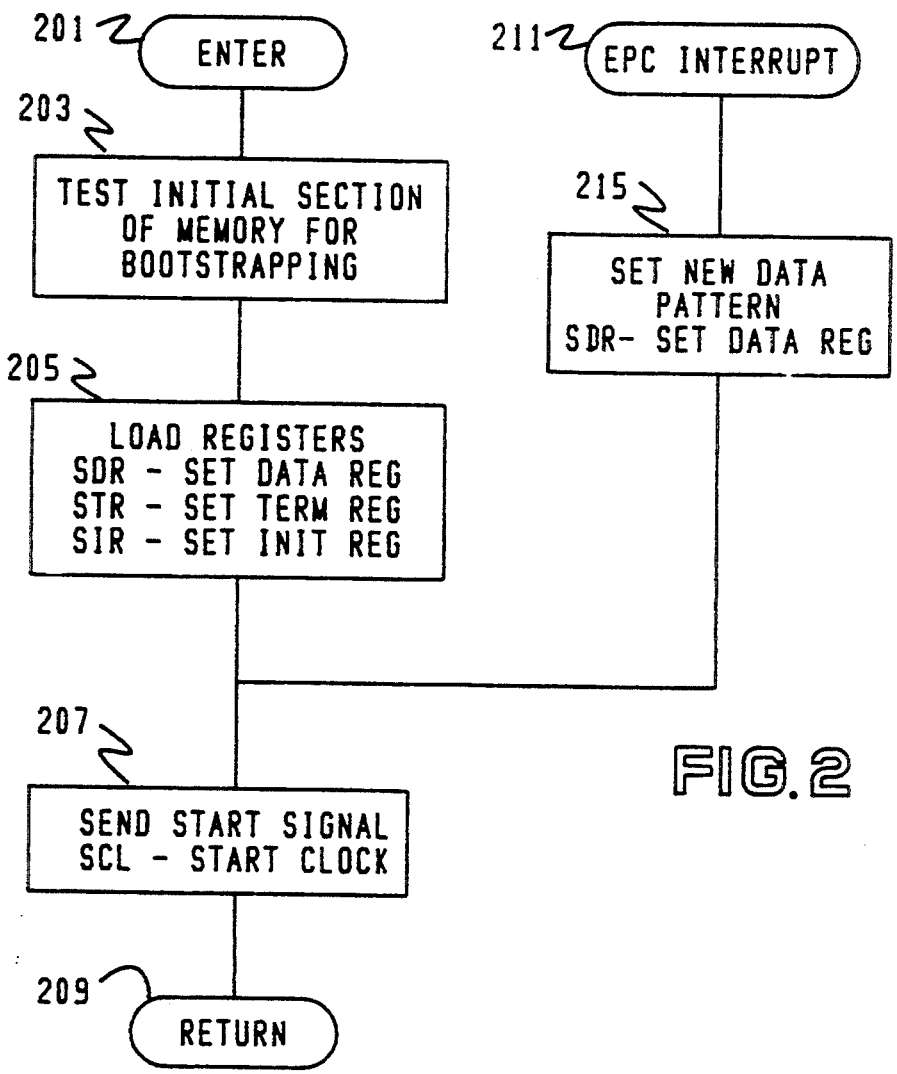
FIG. 2 is a flowchart showing the process for initializing the hardware system of FIG. 1.

FIG. 2 is a flowchart showing the sequence of events by the processor to initialize the registers of the hardware shown in FIG. 1. The procedure is described as a subroutine which is entered at a terminal 201 and, in a process block 203, causes a test of an initial section of memory for the processor's use in bootstrapping and running other programs including the initialization program for this invention.

In a process block 205, the registers are loaded by generating the SDR, STR, and SIR signals on the communications bus while supplying the initial contents on the data bus.

After the registers have been loaded, a process block 207 sends a start signal SCL pattern over the communications bus to start the clock 145 (FIG. 1). Then, at a terminal block 209, the subroutine returns instruction execution to the calling program which then can continue execution of other programs without having to wait until the memory is completely tested.

An EPC interrupt causes the subroutine to be entered at the terminal block 211. A process block 215 sets a new data pattern by generating the SDR signal while the new data pattern is on the data bus. Next, the process block 207 start the clock for the new pattern and the subroutine exits at the terminal block 209.

Figure 3:
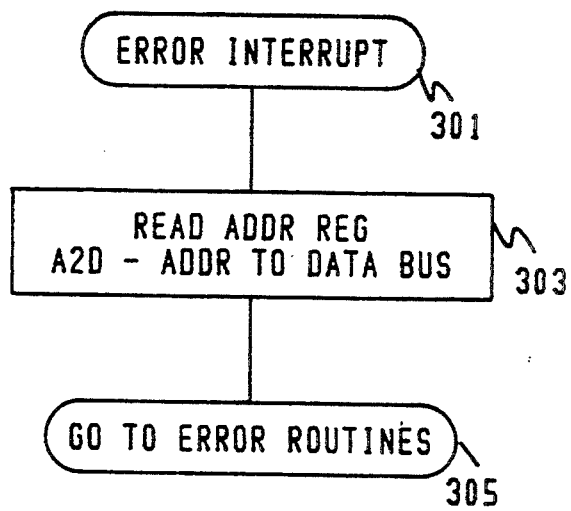
FIG. 3 is a flowchart of an error interrupt.

An error interrupt program is shown in the flowchart of FIG. 3 and comprises a subroutine that is entered at a terminal block 301. A process block 303 causes the address counter 139 (FIG. 1) to be read by supplying an A2D signal via the communication bus to gate the address to the data bus via an AND gate 143 (FIG. 1) to be stored by the processor. A terminal block 305 exits to the error handling routines which utilizes the information concerning the address at which the error occurred. The error routines can be one of several types, but which are not part of the invention and will not be further considered.

To implement the invention as a memory scrubber, the circuit of FIG. 5 can be added to the system of FIG. 1. The decoder 101 and the register 111 have already been described.

An AND gate 501 is used to set the data read from each location of the memory as the address counter is sequenced. The data from the data bus is passed through an ECC (error correction code) network 503. The R/W register 151 of FIG. 1 should be triggered by the same ACK' that is applied to the address counter 139. Such minor modifications and ECC networks are well known in the art and need not be described in further detail for an understanding of the invention. If there were any soft errors in the data read from the memory, they are corrected before being written back.

While the invention has been particularly shown and described with reference to a preferred embodiment thereof, it will be understood by those skilled in the art that various changes and modifications in form and details may be made therein without departing from the spirit and scope of the invention according to the following claims.

What is claimed is:

1. In a processing system including a processor unit coupled to a memory means for executing instructions stored in the memory means that access and utilize data stored in and retrieved from the memory means during access cycles, a testing system for interactively testing the memory means while the processor is executing stored instructions comprising:
    interrupting means for controlling access to the memory means by the testing system while excluding access to the memory means by the processor unit during an access cycle;
    addressing means for supplying address signals to the memory means to select successive location in the memory means not utilized by the processor unit;
    writing means for storing test data in the memory means at locations addressed by the addressing means;
    reading means for retrieving data from the memory means at locations addressed by the addressing means; and
    comparing means coupled to receive test data from the writing means and data retrieved from the memory means by the reading means for verifying that the data stored in locations by the writing means is equal to the data retrieved from the same locations by the reading means.

2. The testing system claimed in claim 1 wherein the comparing means includes signalling means for supplying an error signal to the processor unit when an unequal comparison by the comparing means.

3. The testing system claimed in claim 2 including
    means for coupling the error signal to the processor unit;
    means for coupling the address signals to the processor unit; and
    means in said processor unit responsive to the error signal and to the address signals for indicating the location in the memory means at which an error occurred.

4. A memory test unit comprising:
    memory means for storing data and having address means for accessing an addressed location and data means for selectively reading and writing data at an accessed location;
    processor means for executing predetermined operations and including addressing means for supplying addresses, data input means for accepting data, and data output means for supplying data;
    address bus means for coupling the addressing means of said processor means to said address means of said memory means;
    data bus means for coupling the data means of said memory means with the data input means and the data output means of said processor means; and
    memory accessing means coupled to said address bus means and said data bus means for storing and reading data at addressed locations in the memory means, said memory accessing means including interrupt means coupled to said processor means for suspending execution of operations for a memory access cycle;

address specifying means for supplying addresses to said address bus means, data storage means coupled to said data bus means for supplying data to be written to said memory means, data writing means coupled to the data bus for selectively writing data from said data storage means to a memory location specified by said address specifying means, data reading means for causing data to be retrieved from a memory location specified by said address specifying means and coupled to said data bus means, comparing means coupled to said data bus means and to said data storage means for supplying an error signal when data read from a memory location is not the same as the data written to the same memory location, and means responsive to said error signal for stopping operation of said memory access means.

5. The apparatus as claimed in claim 4 further including in said memory accessing means a means responsive to said comparing means for supplying the error signal to said processor means.

* * * * *